United States Patent
Lin et al.

(10) Patent No.: US 11,793,087 B2
(45) Date of Patent: Oct. 17, 2023

(54) MAGNETIC TUNNEL JUNCTION STRUCTURES AND RELATED METHODS

(71) Applicant: Taiwan Semiconductor Manufacturing Co., Ltd., Hsinchu (TW)

(72) Inventors: Shy-Jay Lin, Hsinchu (TW); Mingyuan Song, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 86 days.

(21) Appl. No.: 17/374,799

(22) Filed: Jul. 13, 2021

(65) Prior Publication Data

US 2021/0343933 A1 Nov. 4, 2021

Related U.S. Application Data

(62) Division of application No. 16/430,343, filed on Jun. 3, 2019, now Pat. No. 11,107,975.

(60) Provisional application No. 62/752,923, filed on Oct. 30, 2018.

(51) Int. Cl.
*H10N 50/80* (2023.01)
*H01F 10/32* (2006.01)
*G11C 11/16* (2006.01)
*H10B 61/00* (2023.01)
*H10N 50/01* (2023.01)
*H10N 50/85* (2023.01)

(52) U.S. Cl.
CPC ........... *H10N 50/80* (2023.02); *G11C 11/161* (2013.01); *H01F 10/329* (2013.01); *H01F 10/3259* (2013.01); *H10B 61/22* (2023.02); *H10N 50/01* (2023.02); *H01F 10/3286* (2013.01); *H10N 50/85* (2023.02)

(58) Field of Classification Search
CPC ....... H01L 43/08; H01L 27/228; H01L 43/12; H10N 50/10; H10N 50/85; H10N 50/01
See application file for complete search history.

(56) References Cited

U.S. PATENT DOCUMENTS

2016/0111632 A1* 4/2016 Sandhu ................. H01L 27/222
 257/421
2018/0301266 A1* 10/2018 Ou ........................ H03B 15/006
2020/0058338 A1 2/2020 Ishikawa et al.

OTHER PUBLICATIONS

Demasius et al., "Enhanced spin-orbit torques by oxygen incorporation in tungsten films," *nature communications*, 2016, (7 pages).

(Continued)

*Primary Examiner* — Samuel A Gebremariam
*Assistant Examiner* — Jonas T Beardsley
(74) *Attorney, Agent, or Firm* — Seed IP Law Group LLP

(57) ABSTRACT

The disclosure is directed to spin-orbit torque ("SOT") magnetoresistive random-access memory ("MRAM") ("SOT-MRAM") structures and methods. A SOT channel of the SOT-MRAM includes multiple heavy metal layers and one or more dielectric dusting layers each sandwiched between two adjacent heavy metal layers. The dielectric dusting layers each include discrete molecules or discrete molecule clusters of a dielectric material scattered in or adjacent to an interface between two adjacent heavy metal layers.

20 Claims, 15 Drawing Sheets

(56) References Cited

OTHER PUBLICATIONS

Hao et al., "Beta (β) tungsten thin films: Structure, electron transport, and giant spin Hall effect," *Appl. Phys. Lett.* 106(182403), 2015, (5 pages).
Wang et al., "A Comparative Study on Spin-Orbit Torque Efficiencies from W/ferromagnetic and W/ferromagnetic Heterostructures," *Phys. Rev. Materials* 2(014403), 2018, (18 pages).

* cited by examiner

MAGNETIC TUNNEL JUNCTION STRUCTURES AND RELATED METHODS

BACKGROUND

Magnetoresistive random-access memory ("MRAM") is a promising non-volatile data storage technology. The core of a MRAM storage cell (or "bit") is a magnetic tunnel junction ("MTJ") in which a dielectric layer is sandwiched between a magnetic fixed layer ("reference layer") and a magnetic free layer ("free layer") whose magnetization polarity can be changed. Due to the tunnel magnetoresistance effect, the resistance value between the reference layer and the free layer changes with the magnetization polarity switch in the free layer. Parallel magnetizations ("P state") lead to a lower electric resistance, whereas antiparallel magnetizations ("AP state") lead to a higher electric resistance. The two states of the resistance values are considered as two logic states "1" or "0" that are stored in the MRAM cell.

In a spin transfer torque ("STT") MRAM ("STT-MRAM") cell, the write current is applied passing through the entire MTJ, i.e., reference layer, the dielectric layer, and the free layer, which sets the magnetization polarity of the free layer through the spin transfer torque effect. That is, the write current passes through a same path as the read path of the MRAM. In a spin-orbit torque ("SOT") MRAM ("SOT-MRAM") cell, a MTJ structure is positioned on a heavy metal layer with large spin-orbit interaction. The free layer is in direct contact with the heavy metal layer. Spin torque is induced by the in-plane current injected through the heavy metal layer under the spin-orbit coupling effect, which generally includes one or more of the Rashba effect or the spin Hall effect ("SHE effect"). The write current does not pass through the vertical MTJ. Instead, the write current passes through the heavy metal layer. The magnetization polarity in the free layer is set through the SOT effect. More specifically, when a current is injected in-plane in the heavy metal layer, the spin orbit coupling leads to an orthogonal spin current which creates a spin torque and induce magnetization reversal in the free layer.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
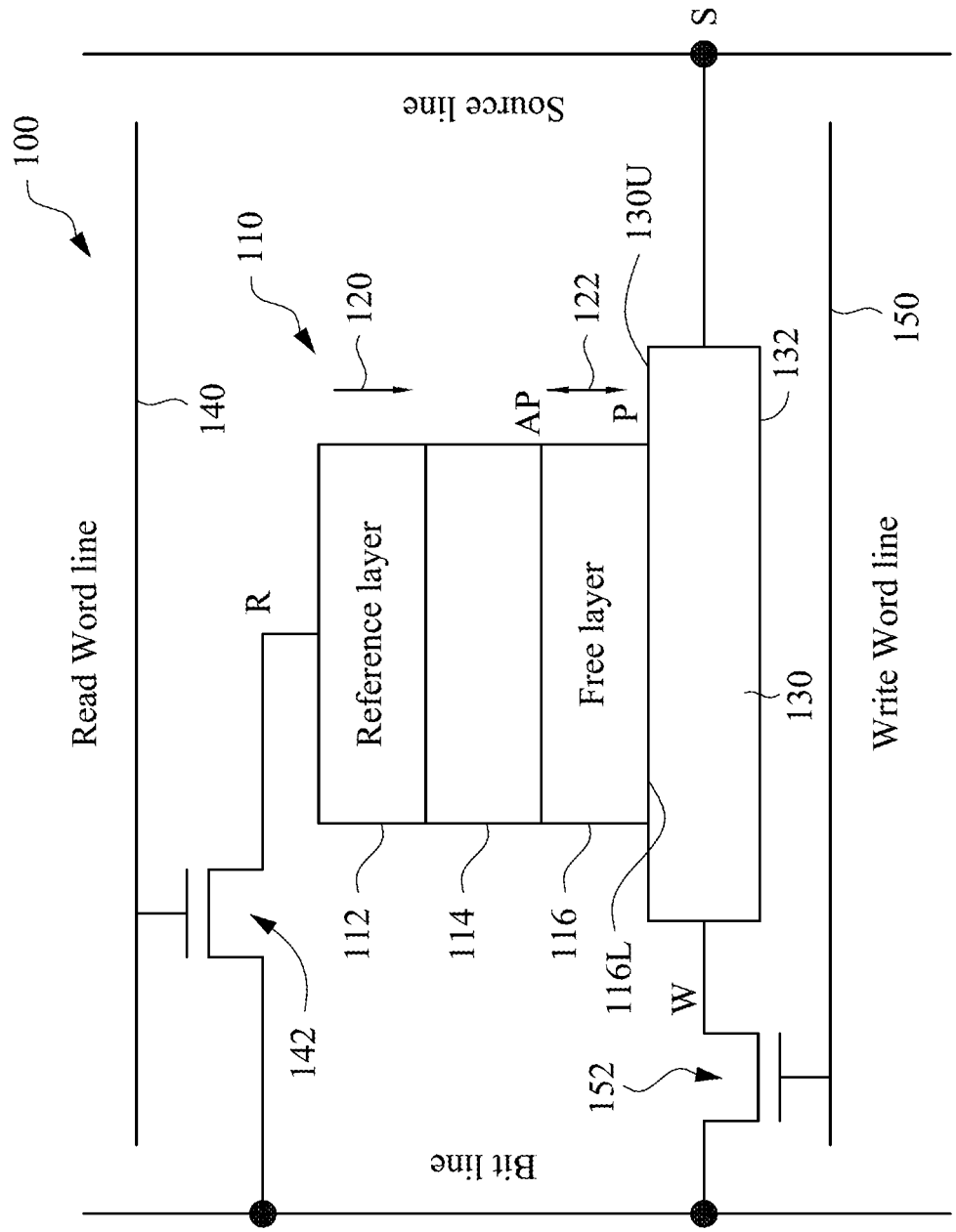
FIG. 1 is an example SOT-MRAM cell according to example embodiments of the disclosure.

The current techniques in accordance with embodiments described herein are created based on the observation that in the SOT-MRAM system design, the resistance of a SOT channel layer, e.g., a heavy metal layer, may be very small compared to other components in the system, e.g., the CMOS transistor. Dependent on the system/circuitry design, it may be desired that the resistance value of a MRAM cell, or specifically, the SOT channel, matches those of other components of the MRAM circuitry. On the other hand, it is not desirable that the increased resistance value of the MRAM cell brings about elevated power consumption. The disclosed techniques are directed to a new structure of the SOT channel that has an enhanced conversion rate from an in-plane current flowing through the SOT channel to a torque on the magnetization of the free layer. An enhanced conversion rate means that a lower write current can achieve a same or similar spin current and the same or similar spin torque on the magnetization due to the fact that the conversion of the orbital to spin angular momentum under the spin orbit coupling is more efficient. The lowered write current may at least partially offset the negative effect of the increased resistance of the SOT channel.

Specifically, in the disclosed techniques, a SOT channel of the MRAM includes multiple heavy metal layers and one or more dielectric dusting layers each sandwiched between two adjacent heavy metal layers. The dielectric dusting layers each include discrete molecules or discrete molecule clusters of a dielectric material scattered in or adjacent to the interface between two adjacent heavy metal layers. That is, the molecules or molecule clusters of the dielectric dusting layers are separated from one another. The average thickness of each dielectric dusting layer is controlled, in the deposition process, to be less than the diameter or size of a single molecule of the dielectric material such that the molecules of the dielectric material are scattered on a surface of the underlying heavy metal layer in the interface between the underlying heavy metal layer and the overlaying heavy metal layer. The thickness of the heavy metal layers is controlled to be sufficiently thin, e.g., between about 5 Å to about 10 Å, such that laterally or in-plane injected charge carriers bounce between or among the discrete molecules of the dielectric dusting layer, which includes vertical bouncing components. The vertical bouncing components of the charge carriers increase the vertical spin current, which improves the efficiency of the conversion from the in-plane injected write current and the vertical spin current.

Further, the average thickness of the dielectric dusting layer is controlled such that the dielectric molecules are positioned more sparsely in-plane on the surface of the underlying heavy metal layer than vertically between adjacent dusting layers. So the dusting layers increase the resistance of the writing channel more or in the lateral direction, e.g., the direction of the write current, than in the vertical direction, i.e., the direction of the spin current. As such the vertical spin current is less affected by the dusting layers.

In an embodiment, the thickness of each heavy metal layer is in the range between about 5 Å to about 10 Å. This thin thickness facilitates the spin-orbit coupling effect because the in-plane current density is increased due to the small edge surface orthogonal to the in-plane write current flow direction. The thickness of the dielectric dusting layer of, e.g., MgO, is in the range of about 0.5 Å to about 1 Å. This thickness is smaller than a size of a MgO molecule, which is generally in the range between about 4 Å. , Besides tungsten, the heavy metal layer may also be platinum ("Pt"), tantalum ("Ta") or other suitable conductive materials. The dusting layer is MgO, SiO2, Fe2O3 or other suitable dielectric materials.

In some embodiments, to maximize the resistance of the SOT channel, the total thickness of the SOT channel layer is controlled to be relatively small. For example, in an embodiment where the heavy metal layers of the SOT channel are tungsten, the total thickness of the write channel layer is about 4 nm. Within the SOT channel layer, the dusting layers constitute about 5 percent to about 20 percent of the total thickness. In an embodiment, the write channel includes at least three heavy metal layers and at least two dielectric dusting layers located in the interfaces among the three heavy metal layers. In an embodiment, each dusting layer exists between two heavy metal layers. That is, the dusting layer does not exist on a surface of the SOT channel layer. In another embodiment, a dusting layer is positioned on at least a surface of the SOT channel, e.g., on a surface that contacts the MTJ structure.

In the description herein, MgO is used as an illustrative example as the dielectric material of the dusting layers. However, the disclosure is not limited by this or any specific example of dielectric materials of the dusting layers.

In an embodiment, the molecules of the dielectric material, e.g., MgO, of the dusting layer are positioned in the interface between two heavy metal layers. Specifically, the MgO molecules are positioned on a first heavy metal layer and are covered by a second heavy metal layer. That is, laterally, the MgO molecules of a dusting layer are scattered, e.g., randomly, in-plane on the surface of the first heavy metal layer. Vertically, the dusting layers of the scattered MgO molecules are separated by the heavy metal layers. That is, vertically, the distribution of the MgO molecules is not random and is structured.

In another embodiment, the MgO molecules are initially formed in the interface between the first heavy metal layer and the second heavy metal layer. In the following fabrication processes, the initially formed MgO molecules diffuse into the heavy metal layers due to, e.g., the heating involved in the following fabrication processes. Measures are taken to control the diffusion process such that the diffused MgO molecules are substantially on a same plane or thickness level within the relevant heavy metal layer. In the case that the MgO molecules are diffused from two opposite surfaces of the heavy metal layer, e.g., from upper surface and from bottom surface, the diffused MgO molecules may form two planes of MgO molecules within the heavy metal layer. For example, the MgO molecules diffused from the overlying dusting layer are positioned on a first plane and the MgO molecules diffused from the underlying dusting layer are positioned on a second plane within the heavy metal layer. The first plane may or may not be closer to the upper surface of the heavy metal layer than the second plane.

In a further embodiment, the MgO molecules are initially formed in the interface between the first heavy metal layer and the second heavy metal layer. In the following fabrication processes, at least some of the initially formed MgO molecules diffuse randomly into the first heavy metal layer and the second heavy metal layer. The initial positions of the MgO molecules in the interfaces between thin heavy metal layers enable or facilitate random distribution of the MgO molecules within the SOT channel.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 shows an example 2T1MTJ bit cell 100 of a SOT-MRAM device. The bit cell 100 includes a MTJ structure 110 that includes a dielectric layer 114 sandwiched between a first ferromagnetic layer 112 and a second ferromagnetic layer 116. The first ferromagnetic layer 112 and the second ferromagnetic layer 116 include a same magnetic anisotropy. Specifically, the first ferromagnetic layer 112 and the second ferromagnetic layer 116 either both have in-plane magnetic anisotropy or both have perpendicular magnetic anisotropy. In the description herein, for an illustrative example, the first ferromagnetic layer 112 and the second ferromagnetic layer 116 include perpendicular magnetic anisotropy. The magnetization or magnetic moment of the first ferromagnetic layer 112 maintains a fixed orientation or polarity, e.g., in the down direction as shown by a unidirectional arrow 120, perpendicular to a substrate plane (not shown for simplicity) or a plane which the MTJ 110 sits on. The magnetization orientation of the second ferromagnetic layer 116 is switchable in the perpendicular axis, as shown by a bi-directional arrow 122. The switchable magnetization orientation of the second ferromagnetic layer 116 represents two states thereof with respect to the magnetization orientation of the first ferromagnetic layer 112, a parallel state "P" or an antiparallel state "AP". In the "P" state, the magnetization orientation of the second ferromagnetic layer 116 is in the same direction as that of the first ferromagnetic layer 112, here in the down direction. In the "AP" state, the magnetization orientation of the second ferromagnetic layer 116 is in a different direction as that of the first ferromagnetic layer 112, here in the up direction. In the description herein, the first ferromagnetic layer 112 is referred to as a "reference layer" and the second ferromagnetic layer 116 is referred to as a "free layer." The dielectric layer 114 is a tunnel barrier layer. The amount of tunneling current through the tunnel barrier layer 114 is a function of the relative orientations of the magnetizations of the reference layer 112 and the free layer 116. If the magnetizations of the reference layer 112 and the free layer 116 are anti-parallel to each other, the probability of the electrons tunneling through the tunnel barrier layer 114 is lowered, so that a high junction resistance is obtained. On the other hand, if the magnetizations of the reference layer 112 and the free layer 116 are parallel to each other, the probability of the electrons tunneling through the tunnel barrier layer 114 is increased and a high tunnel current and low junction resistance is obtained.

A write channel layer 130 is positioned adjacent to and in electric coupling with the free layer 116. In an embodiment, the write channel layer 130 is in direct contact with the free layer 116. For example, an upper surface 130U of the write channel layer 130 is in direct contact with a lower surface 116L of the free layer 116. In some embodiments, to maximize the spin Hall effect ("SHE") between the write channel layer 130 and the free layer 116, an interface area 132 between the write channel layer 130 and the free layer 116 substantially fully overlaps the lower surface 116L of the free layer 116. That is, the upper surface 130U of the write channel layer 130 substantially fully overlap the lower surface 116L of the free layer 116. In an embodiment, the upper surface 130U is larger than the lower surface 116L in at least some directions.

Due to the tunnel magnetoresistance effect, the resistance value between the reference layer and the free layer changes with the magnetization polarity switch in the free layer 116. The parallel magnetizations (P state) lead to a lower electric resistance across MTJ 110, whereas the antiparallel magnetizations (AP state) lead to a higher electric resistance across MTJ 110. The two states of the resistance values are considered as two logic states "1" or "0" that are stored in the MRAM bit cell 100.

The bit cell 100 includes three terminals R, W and S. In a read operation, a signal from a read control line, e.g., a read Word line, turns on a read transistor 142 to enable a read current to flow between a Bit line and a source line through the MTJ structure 110. A value of the read current indicates the resistance value of the MTJ, i.e., the logic state stored in the MRAM cell 100. In a write operation, a signal from a write control line, e.g., a write Word line 150, turns on a write transistor 152 to enable a write current to pass through the write channel 130 to generate a spin-orbit torque that changes the magnetization orientation of the free layer 116. The mechanisms of the spin-orbit torque include one or more of spin Hall effect ("SHE") or a Rashba effect. The relative ratios between the SHE and the Rashba effect depend on the device structure, fabrication processes and/or material choices. However, the current disclosure is applicable to and is not limited by all these factors and any resultant ratios between the SHE and Rashba effect. In the description herein, it is assumed that SHE dominates the spin-orbit torque ("SOT"). The terms "SHE" or "SOT" may be used interchangeably in referring to the spin-orbit torque.

As the MTJ 110 includes perpendicular anisotropy, some additional mechanisms may be used to deterministically switch the magnetization orientation of the free layer 116. For example, an additional in-plane magnetic field may be applied. In another example, a shape anisotropy, e.g., the long axis, of the MTJ structure 100 may be position with a canting angle with a current flow direction of the write channel 130. All such additional features are possible with the disclosed techniques are included in the disclosure.

In some embodiments, the write operation may be implemented with a bidirectional current through the write channel 130 to set up the two magnetization orientations, e.g., up or down, in the free layer 116. In other embodiments, the different magnetization orientations in the free layer 116 may be achieved through different switching mechanisms. For example, the AP state writing may be achieved through the SOT effect by an in-plane current passing through the write channel 130, while the P state writing may be achieved through the STT effect via a current passing through the MTJ structure 110 in an opposite direction to the read operation. Other approaches of writing to the SOT-MRAM cell 100 are also possible and included in the disclosure.

Generally, the resistance values of the MTJ structure 110, no matter in the P state or in the AP state, are in the scale of thousands of Ohms. The resistance values of heavy metals, e.g., platinum, tantalum or tungsten, which are suitable conductive materials for generating the spin-orbit torque, are in the scale of tens or at most hundreds of Ohms. Such vast differences in the resistance values of a same MRAM cell in different operations, e.g., between read and write operations, would pose challenges to the circuitry design, especially that with the technology nodes shrinking, the design rules tend to have much lower tolerance on current variations.

In the example MRAM cell 100, however, the write channel 130 includes a multi-layer structure that includes layers of heavy metal materials and layers of dielectric materials. Each layer of dielectric material is positioned between two adjacent heavy metal layers. As such, the dielectric layers are each sandwiched between heavy metal layers. In each dielectric layer, the molecules of the dielectric material do not form a continuous film or flake. Instead, the dielectric molecules are randomly distributed or scattered in-plane on a surface of the underlying heavy metal layer as individual discrete molecules or individual clusters of multiple molecules. That is, the individual or discrete dielectric molecules are separated from one another.

Figure 2:
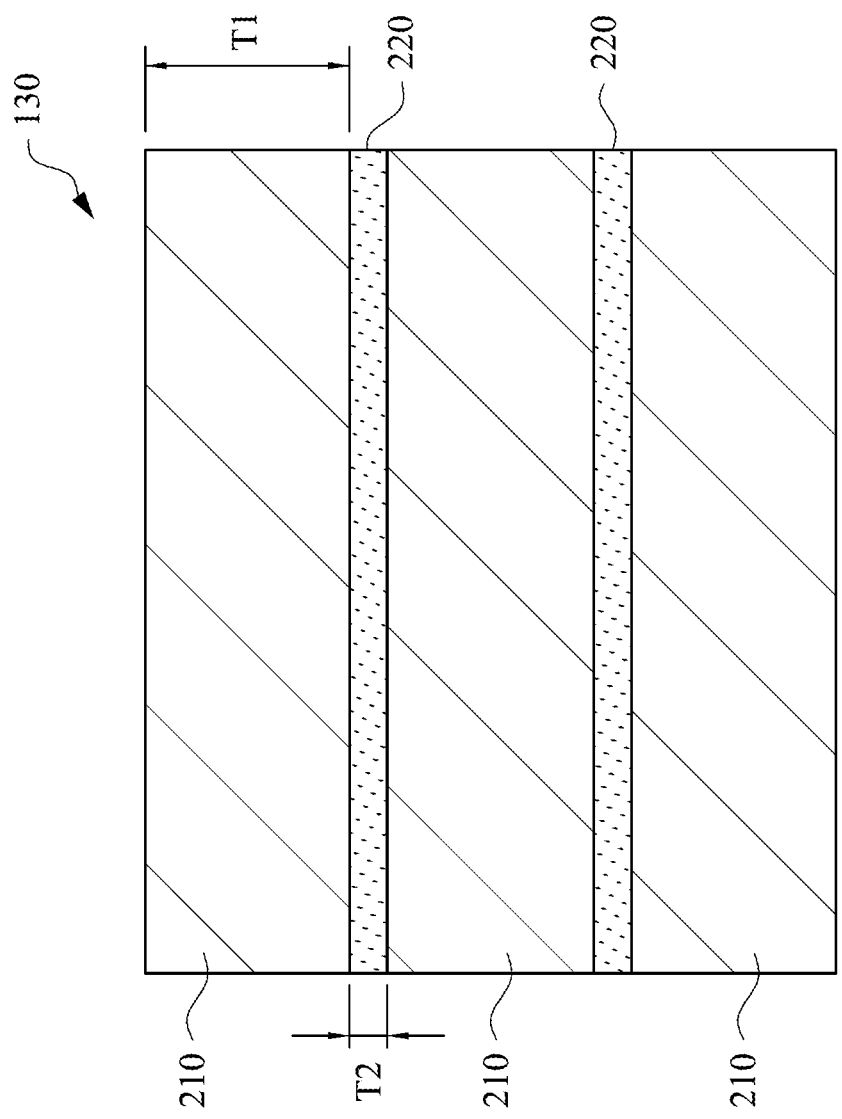
FIG. 2 is a cross-sectional view of an example SOT channel according to example embodiments of the disclosure.

FIG. 2 shows a cross-sectional view of an example write channel layer 130. Referring to FIG. 2, the example write channel 130 includes three heavy metal layers 210 and two dielectric layers 220 stacked vertically upon one another. Each dielectric layer 220 is sandwiched between adjacent two heavy metal layers 210. The heavy metal layers 210 are one or more of platinum, tantalum, tungsten or other suitable conductive materials. In some embodiments, the thickness T1 of each heavy metal layer 210 is maintained within a range of about 5 Å to about 15 Å such that the heavy metal layer 210 does not provide sufficient space for electrons to flow through the conduction band of the heavy metal layer 210. Instead, the electrons tend to bounce between or among the dielectric molecules of the adjacent dielectric layer 220 in passing through the write channel 130. In an embodiment, the thickness T1 is within a range of about 5 Å to about 10 Å. In an embodiment, all the heavy metal layers 210 include a substantially same thickness T1. In another embodiment, the thickness values of some of the heavy metal layers 210 are different from one another. For example, the thickness value of a heavy metal layer 210 that is adjacent to two dielectric layers 220 may be different from the thickness value of a heavy metal layer 210 that is adjacent to only one dielectric layer 220.

The dielectric layer 220 is one or more of MgO, $SiO_2$, $Fe_2O_3$ or other suitable dielectric materials. In an embodiment, a thickness T2 of the dielectric layers 220 is maintained within a range of between about 0.5 Å to about 1 Å. Such a thickness is lower than a diameter of a single molecule of the dielectric material, e.g., MgO, $SiO_2$, $Fe_2O_3$. As a result, it is facilitated that the molecules or molecule clusters of the dielectric material are randomly scattered in-plane in the interface between two adjacent heavy metal layers 210 and do not form a continuous flake or film of dielectric material. As the molecules of the dielectric material are scattered within the dielectric layer 220, the dielectric layer 220 is also referred to as a dielectric "dusting" layer 220. It should be appreciated that the thickness T2 of the dielectric layer is actually an "average thickness" and is controlled through the deposition process. The dielectric layer 220 is not a continuous film or flake of dielectric materials and the thickness ("average thickness") is an average thickness of the randomly scattered individual molecules or individual clusters of molecules.

As the molecules of the dielectric layer 220 are randomly scattered, it is possible that some of them are bonded together to form a cluster of molecules. However, with the average thickness control, as described herein, the molecule of the dielectric layer or the clusters of the molecules are random and discrete and do not form a continuous flake. In the description herein, the dielectric layers 210 are described as having randomly scattered molecules for simplicity purposes. It should be appreciated that all the descriptions herein about a molecule of a dielectric layer 220 may be similarly applied to a cluster of molecules of the dielectric layer 210, which is included in the disclosure.

In an embodiment, the overall volume ratio between the dielectric layers 220 and the heavy metal layers 210 in the write channel 130 is in a range of between about 1:20 to about 1:5. The ratio is controlled based on one or more of the factors that the heavy metal layers 210 are each sufficiently thin, e.g., between about 5 Å to about 15 Å, such that the electrons bounce between the adjacent dielectric molecules, that the dielectric layer 220 is sufficiently thin such that the dielectric molecules or clusters of dielectric molecules are randomly scattered in-plane, and/or that the composition ratio of the dielectric material is not too high such that the overall resistance value of the write channel 130 matches that of the MTJ structure 110 under circuitry design rules. The criteria in determining whether the resistance value of the write channel 130 matches the resistance value of the MTJ depends on the specific circuitry design, which does not limit the scope of the disclosure. In an embodiment, a ratio between the resistance value of the write channel 130 and the resistance value of the MTJ structure 110 is within ranges of about 1:1 to 1:2 for the P state of the MTJ 110 and/or about 1:1.6 to 1:3.2 for the AP state of the MTJ 110.

Figure 3A:
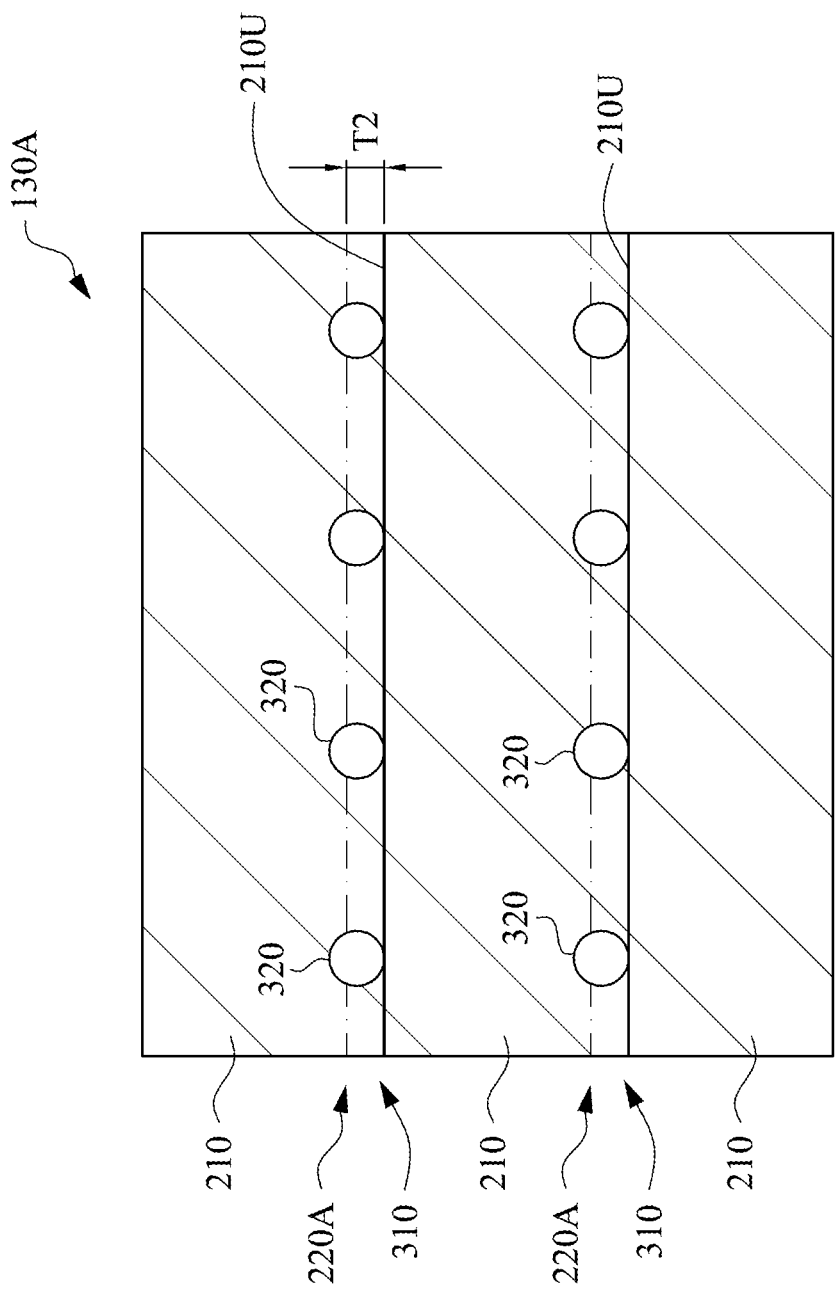
FIGS. 3A to 3C are examples of dielectric layers in the example SOT channel according to example embodiments of the disclosure.
Figure 3B:
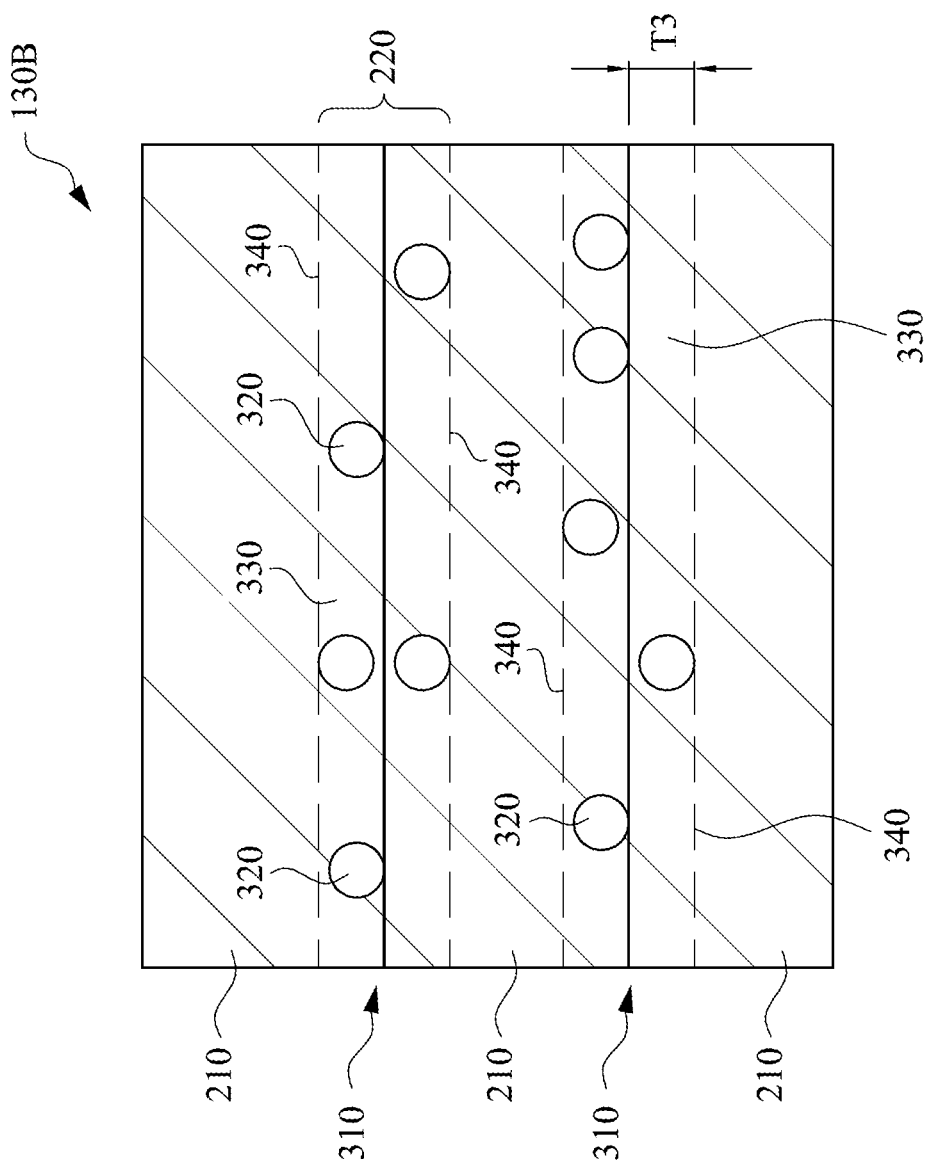
Figure 3C:
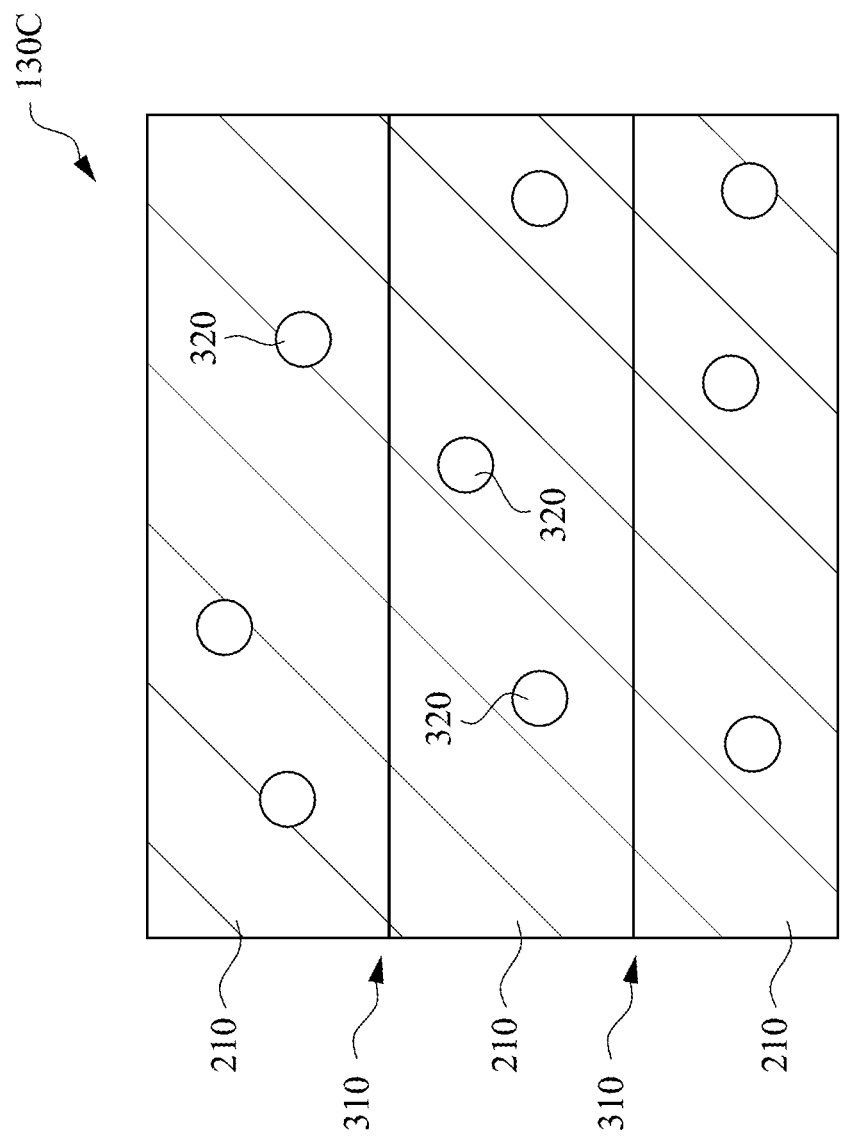

FIGS. 3A to 3C illustrate various embodiments of the distribution of the molecules in the dielectric layers 210. Referring to FIG. 3A, in an embodiment write channel 130A, the molecules 320 of the dielectric layer 220A, shown with dotted line to indicate the average thickness T2, are position on the interface 310 between two adjacent heavy metal layers 210. Specifically, a molecule 320 is positioned on upper surface 210U of an underlying heavy metal layer 210 and is covered by an overlying heavy metal layer 210. All the molecules 320 of a dielectric layer 220A are positioned on a same plane, e.g., the upper surface 210U of the underlying heavy metal layer 210. That is, the molecules of the dielectric layers 220A are structurally distributed vertically, e.g., separated by the heavy metal layers 210, and are randomly distributed laterally within the plane of the interface 310 between two adjacent heavy metal layers 210.

FIG. 3B illustrates an example write channel 130B. In write channel 130B, the molecules 320 of the dielectric layer 220B are distributed randomly within an area 330 of the heavy metal layer 210 that is adjacent to the interface 310 between two adjacent heavy metal layers 210. That is, the molecules 320 distributed within the heavy metal layer 210 do not form a continuous layer and are positioned as discrete molecules or molecule clusters. Edge lines 340 of the diffusion areas 330 are shown with dotted lines. The area 330 is referred to as diffusion area 330 because the molecules 320 of the dielectric layer 220 have diffused into the diffusion area 330 due to energies applied through heating or other approaches. With careful control of the diffusion process, e.g., the energy level and/or the lasting period of the applied energy, the thickness T3 of a diffusion area 330 is maintained within a range between about 1.25 Å to about 2.5 Å. In another embodiment, the thickness T3 of the diffusion area 330 is maintained as smaller than about ¼ of the thickness T1 of the heavy metal layer 210. As such, the molecules 320 of the dielectric layer 220, shown as within the diffusion areas 330 of the two adjacent heavy metal layers 210, are randomly distributed about the interface 310 and within the diffusion areas 330 of the two adjacent heavy metal layers 210. A heavy metal layer 210 may include an upper diffusion area 330 and a lower diffusion area 330 adjacent to an overlying heavy meal layer 210 and an underlying heavy metal layer 210, respectively. Due to the thickness control of the thickness T3 of the diffusion area 330, the upper diffusion area 330 and the lower diffusion area 330 of a same heavy metal layer 210 do not overlap with one another. As such, in the vertical dimension, the distribution of the molecules of the dielectric layer 220 is structurally restricted within the relevant diffusion areas 330 that are adjacent to the relevant interface 310. The molecules of the dielectric layer 220 are distributed about the corresponding interface 310. Within the relevant diffusion areas 330, the distribution of the molecules 320 are random, both laterally and vertically. But the diffusion areas 330 are restricted to be adjacent to the corresponding interface 310 and are not overlapping with one another. That is, vertically, the distribution of the molecules 320 of the dielectric layers 220 is not fully random.

FIG. 3C shows an example write channel 130C. In write channel 130C, the molecules 320 of the dielectric layers 220 are substantially randomly distributed within each heavy metal layer 210. The random distribution is achieved in a two-step process. In the first step, the dielectric material are formed in the interface 310 between heavy metal layers 210, as shown in FIG. 3A. In a second step, the molecules 320 of the dielectric layer 220 (FIG. 3A) are diffused into the adjacent heavy metal layers 210, through e.g., heating.

Because the dielectric material layers are initially formed in the interface 310 between adjacent heavy metal layers 210, the diffused molecules 320 are more randomly distributed among all the thin heavy metal layers 210 than dielectric molecules diffused into a thicker heavy metal layer through doping.

In the example write channels 130B, 130C, the dielectric layers are initially formed in a manner similar to that of the example write channel 130A of FIG. 3A. Then the molecules 320 are diffused into the heavy metal layers 210. The diffusion may be conducted through a dedicated diffusion process or may be conducted as a controlled side-effect of other fabrication processes subsequent to the formation of the MRAM cell 100. For example, the heating effects of the annealing processes and/or the oxidation processes may be utilized to effectuate the diffusion processes to achieve the write channels 130B, 130C. Measures may be taken to control the diffusion processes to achieve the different structure features as shown in the write channel 130B and the write channel 130C.

Figure 4:
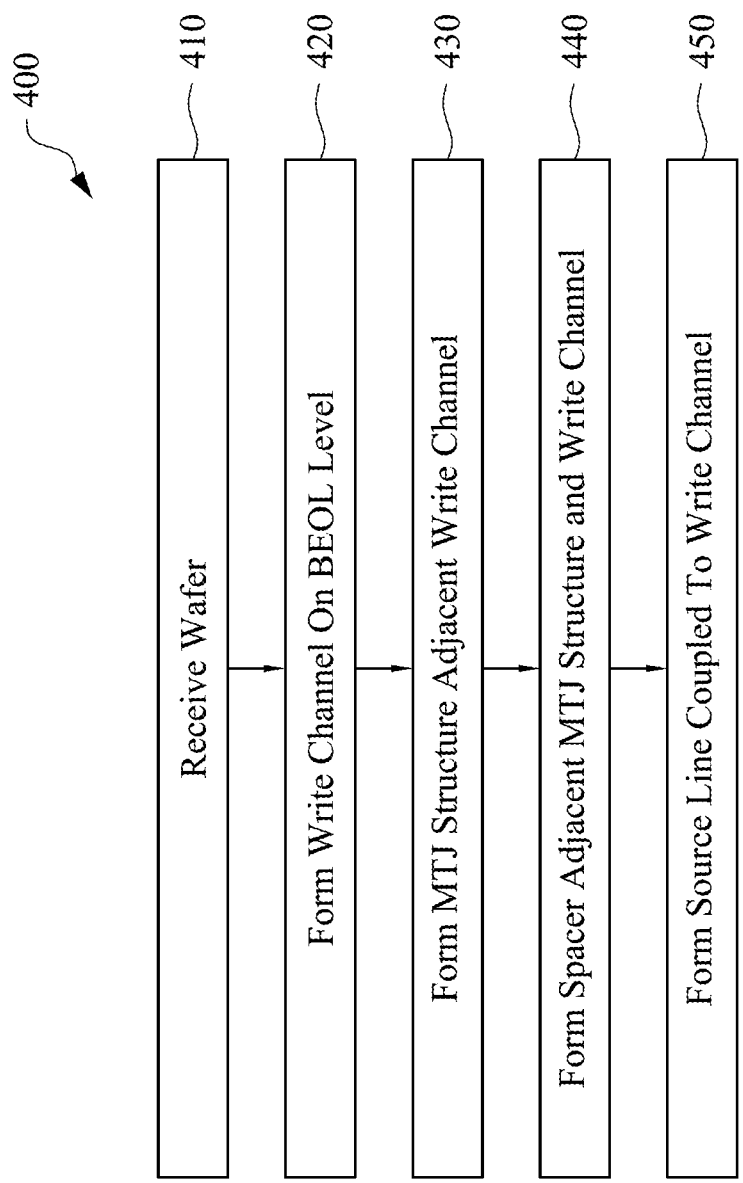
FIG. 4 is an example process according to the disclosure.

FIG. 4 shows an example process 400 which may be used to make the MRAM cell 100 or other semiconductor structures. FIGS. 5A to 5E show a wafer 500 in various stage of the process of FIG. 4.

Figure 5A:
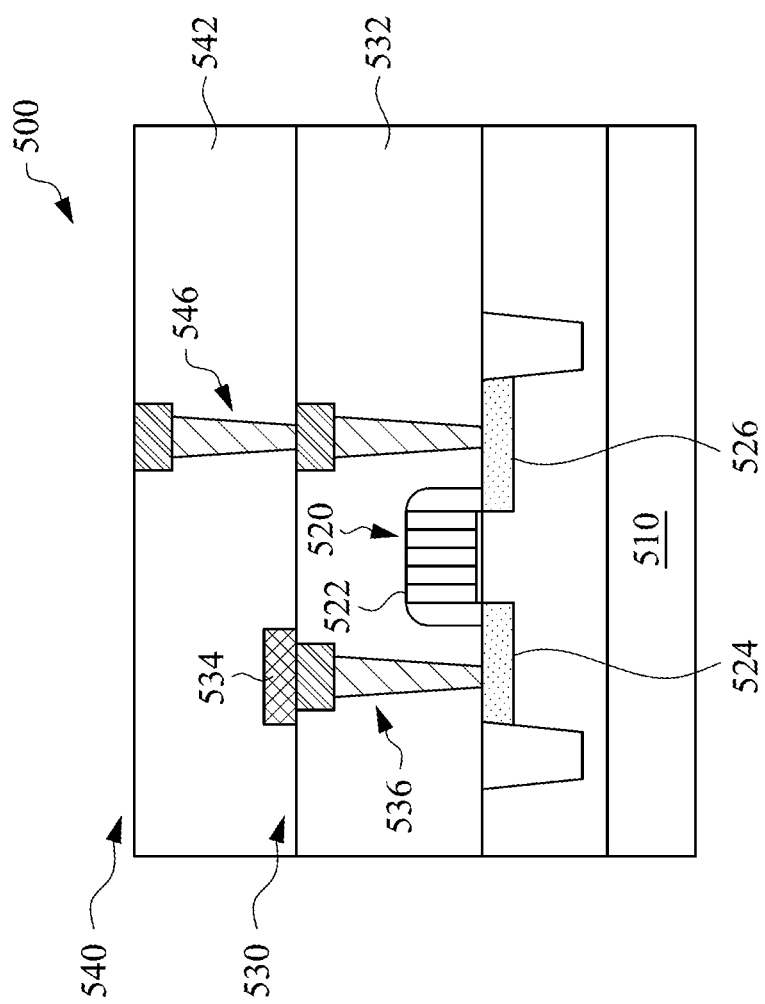
FIGS. 5A to 5E are various states of a wafer under the example process of FIG. 4.

Referring to FIG. 4, in example operation 410, a wafer 500 is received. The wafer 500 includes a substrate 510 and a transistor 520 formed over the substrate 510. The transistor 520 includes a gate 522, a first source/drain structure 524 and a second source/drain structure 526. The wafer 500 also includes a first back-end-of-line ("BEOL") level 530 that is formed over the transistor 520 and a first inter-level dielectric ("ILD") layer 532. For example, a Bit line 534 is on the first BEOL level 530. FIG. 5A shows, as an illustrative example, that the first BEOL level 530 is one level, e.g., one layer of ILD 532, over the transistor 520, which is not limiting. The first BEOL level 530 may be formed more than one level over the transistor 520. All are included in the disclosure. The Bit line 534 is electrically coupled to the first source/drain structure 524 through interconnect structures 536, e.g., a contact plug or via.

The wafer 500 also includes a second BEOL level 540 formed at a different level from the first BEOL level 530 over the transistor 520. FIG. 5A shows, as an illustrative example, that the second BEOL level 540 is formed over the first BEOL level 530, which is not limiting. It is possible that the second BEOL level 540 is formed below the first BEOL level 530 while the Bit line 534 on the first BEOL level 530 is formed after structures on the second BEOL level 540 have been formed. The second BEOL level 540 is formed over the second ILD layer 542. Interconnect structures 546 are already formed in the wafer 500 for coupling features on the second BEOL level 540. In an example, the second interconnect structure 546 is electrically coupled to the second source/drain structure 526 of the transistor 520.

Figure 5B:
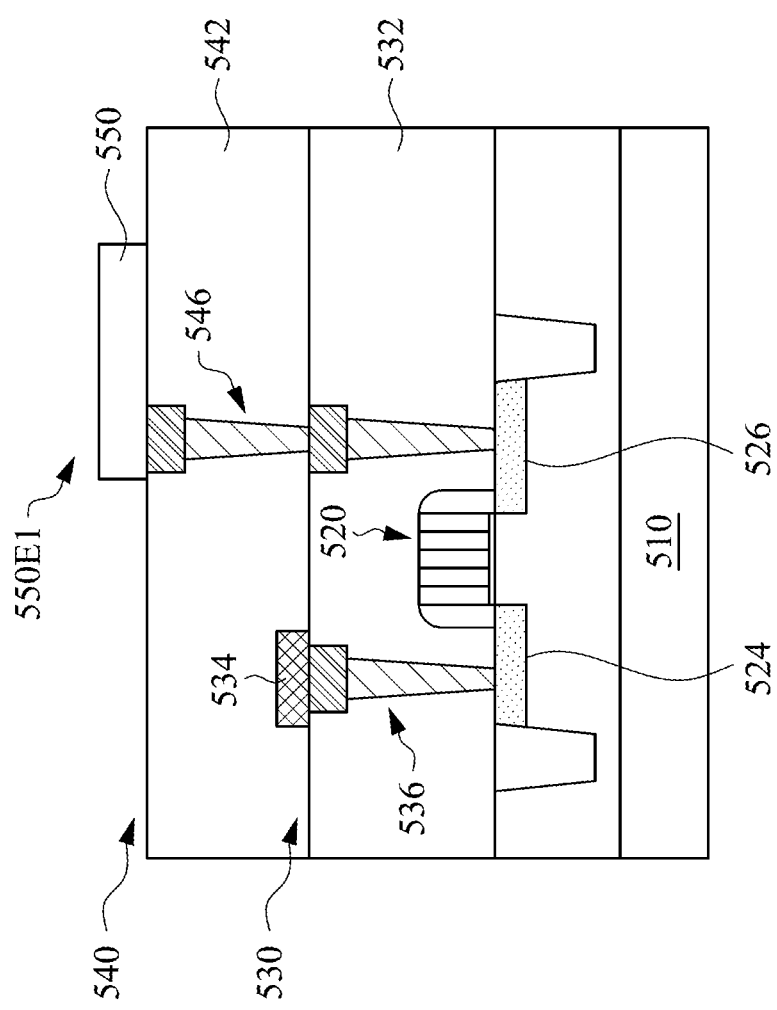

In example operation 420, with reference also to FIG. 5B, a write channel 550 is formed on the second BEOL level 540. Specifically, the write channel 550 is formed over the second ILD layer 542. A first end 550E1 is coupled to the second interconnect structure 546, which is coupled to the second source/drain structure 526.

The formation of the write channel 550, as an overall structure, may be implemented through any suitable approaches and all are included in the disclosure. For example, the write channel 550 materials may be initially formed as a layer(s) over the wafer 500 surface and later patterned to form the write channel 550. For another example, a lift-off or a damascene process is used to form the write channel 550. For example, a dielectric layer (not shown for simplicity) is formed over the second ILD layer 542 and is patterned to open an aperture exposing the second interconnect structure 546. The write channel 550 is formed within the aperture. The excessive deposition material may be removed together with the dielectric material in a lift-off process or be removed through a CHIP process in a damascene process. The dielectric layer may be further patterned to form other structures, e.g., a spacer structure adjacent to the write channel layer 550. Optionally, an etch stop layer (not shown for simplicity), e.g., of silicon nitride is formed between the dielectric layer and the second ILD 542. The specific examples of forming the write channel 550 are further described herein.

Optionally, an electrode layer (not shown for simplicity purposes), referred to as bottom electrode for descriptive purposes, is formed between the write channel layer 550, e.g., the first end 550E1 thereof, and the second interconnect structure 546.

Figure 5C:
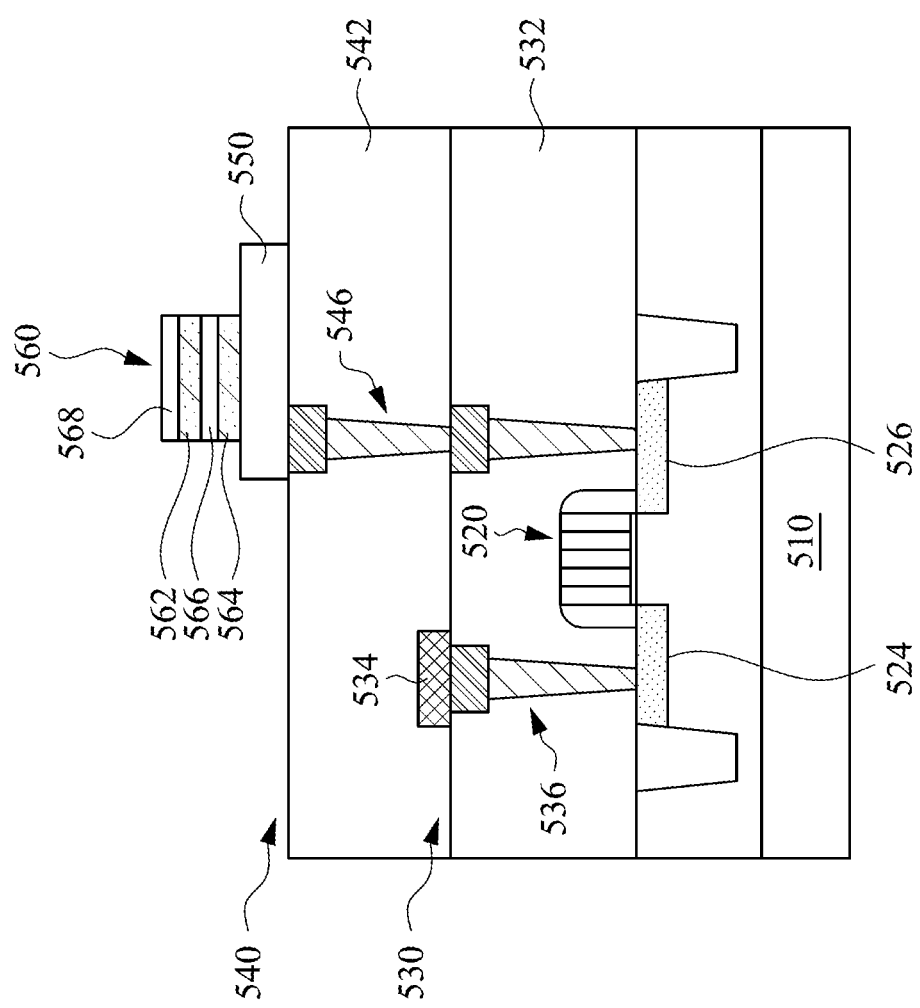

In example operation 430, with reference also to FIG. 5C, a MTJ structure 560 is formed adjacent to, e.g., over, the write channel 550. The MTJ structure 560 includes a first ferromagnetic layer 562 and a second ferromagnetic layer 564, which are separated by a tunneling barrier layer 566. As an illustrative example, the first ferromagnetic layer 562 has a fixed or "pinned" magnetization orientation and the second ferromagnetic layer 564 has a switchable or free magnetization orientation. The first ferromagnetic layer 562 is referred to as the "reference layer" 562 and the second ferromagnetic layer 564 is referred to as the "free layer" 564. In an embodiment, the free layer 564 is one or more of Fe, Co, Ni, FeCo, CoNi, CoFeB, FeB, FePt, FePd or other suitable ferromagnetic material. The reference layer 562 is one or more of Fe, Co, Ni, FeCo, CoNi, CoFEB, FeB, FePt, FePd or other suitable ferromagnetic material. In an embodiment, the reference layer 562 is a synthetic anti-ferromagnetic structure that includes one or more non-magnetic ("NM") metal layers each sandwiched between two pinned ferromagnetic ("FM") layers. In an embodiment, the free layer 562 is a synthetic anti-ferromagnetic structure that includes a non-magnetic metal layer sandwiched between two free ferromagnetic layers. For example, the free layer 564 may include a Ta layer sandwiched between two CoFeB layers.

In some embodiments, a capping layer 568, e.g., of $WO_2$, NiO, MgO, $Al_2O_3$, $Ta_2O_5$, $MoO_2$, TiO, GdO, Al, Mg, Ta, Ru other suitable materials are formed over the reference layer 562.

The layers of the MTJ 560 may be deposited over the surface of the wafer 500 and patterned to form the MTJ 560 structure. Other approaches, like the lift-off process or the damascene process, are also available to form the MTJ structure 560. A shape anisotropy of the MTJ 560 may have a canting angle with a current flow direction of the write channel 550.

Figure 5D:
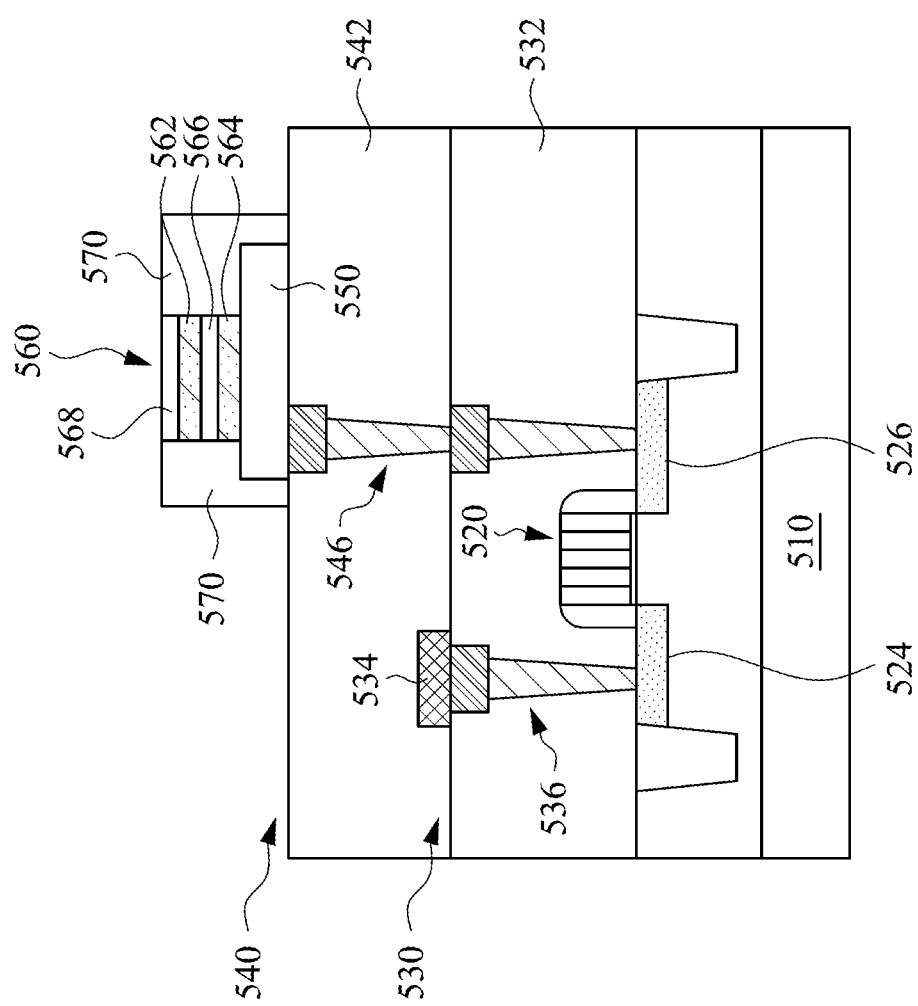

In example operation 440, with reference also to FIG. 5D, optionally, a spacer 570 is formed adjacent to the MTJ structure 560 and the write channel 550. The spacer 570 may be formed using any suitable deposition techniques and is typically formed conformally. The spacer 570 is one or more of SiN, SiC, $Si_3N_4$, SiON or other suitable dielectric materials that is different from the dielectric material of the first ILD layer 532 and/or the second ILD layer 542, which is silicon oxide or low-K dielectric materials.

The example structure of FIG. 5D is provided as an illustrative example of a SOT-MRAM cell and the silicon implementation. Alternative or additional MTJ structures and silicon implementations are also possible and included in the disclosure. For example the SOT-MRAM cell may also include an AP-coupling layer and a hard layer (not shown for simplicity) adjacent to the reference layer 562 to pin the magnetization orientation of the reference layer 562. The SOT-MRAM cell may also include an antiferromagnetic layer and/or a ferromagnetic biasing layer adjacent to the free layer 564, which functions to facilitate the SOT effect in switching the magnetization orientation of the free layer 564. A bottom electrode may be formed adjacent to the write channel 550 and a top electrode may be formed adjacent to the reference layer 562. These additional or alterative features are all possible and included in the disclosure.

FIG. 5D shows that in the MTJ structure 560, the free layer 564 is stacked below the reference layer 562 for illustrative purposes. In other embodiment, the free layer is stacked over the reference layer and the write channel layer is position adjacent to the free layer over the reference layer.

In an embodiment, the reference layer 562 or the respective electrode thereof is electrically coupled to the Bit line 534 through interconnect structures and another transistor, which are not shown for simplicity.

FIG. 5D shows that the write channel 550 connects directly to the interconnect structure 546, which is not limiting. The write channel 550 may be electrically coupled to the second source/drain structure 526 through an electrode and interconnect structures coupled to the electrode.

The ILD layers 532, 542 are each silicon oxide or suitable low-K dielectric materials.

Figure 5E:
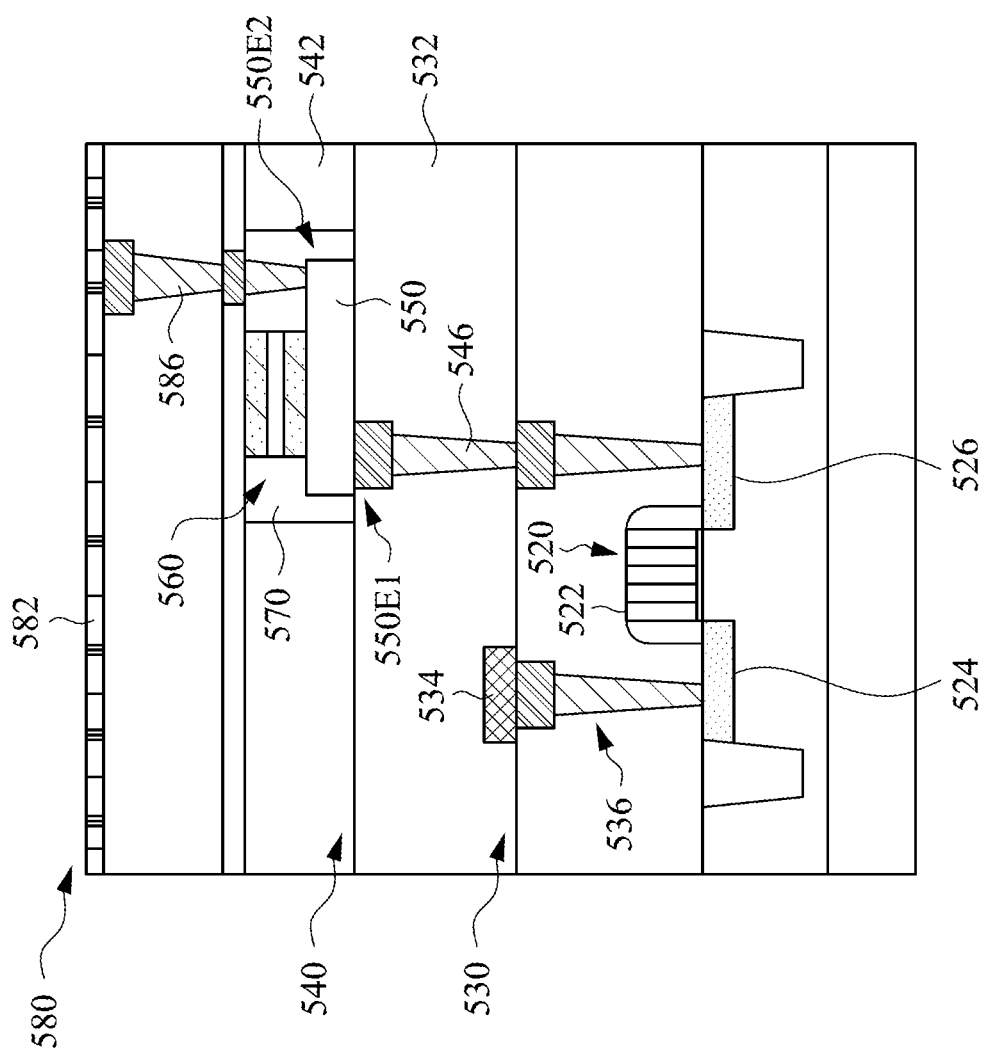

In example operation 450, with reference also to FIG. 5E, a source line 582 is formed over a third BEOL level 580. The source line 582 is coupled, through interconnect structures 586, to a second end 550E2 of the write channel 550. In an embodiment, an in-plane write current is configured to flow from the first end 550E1 to the second end 550E2.

Figure 6:
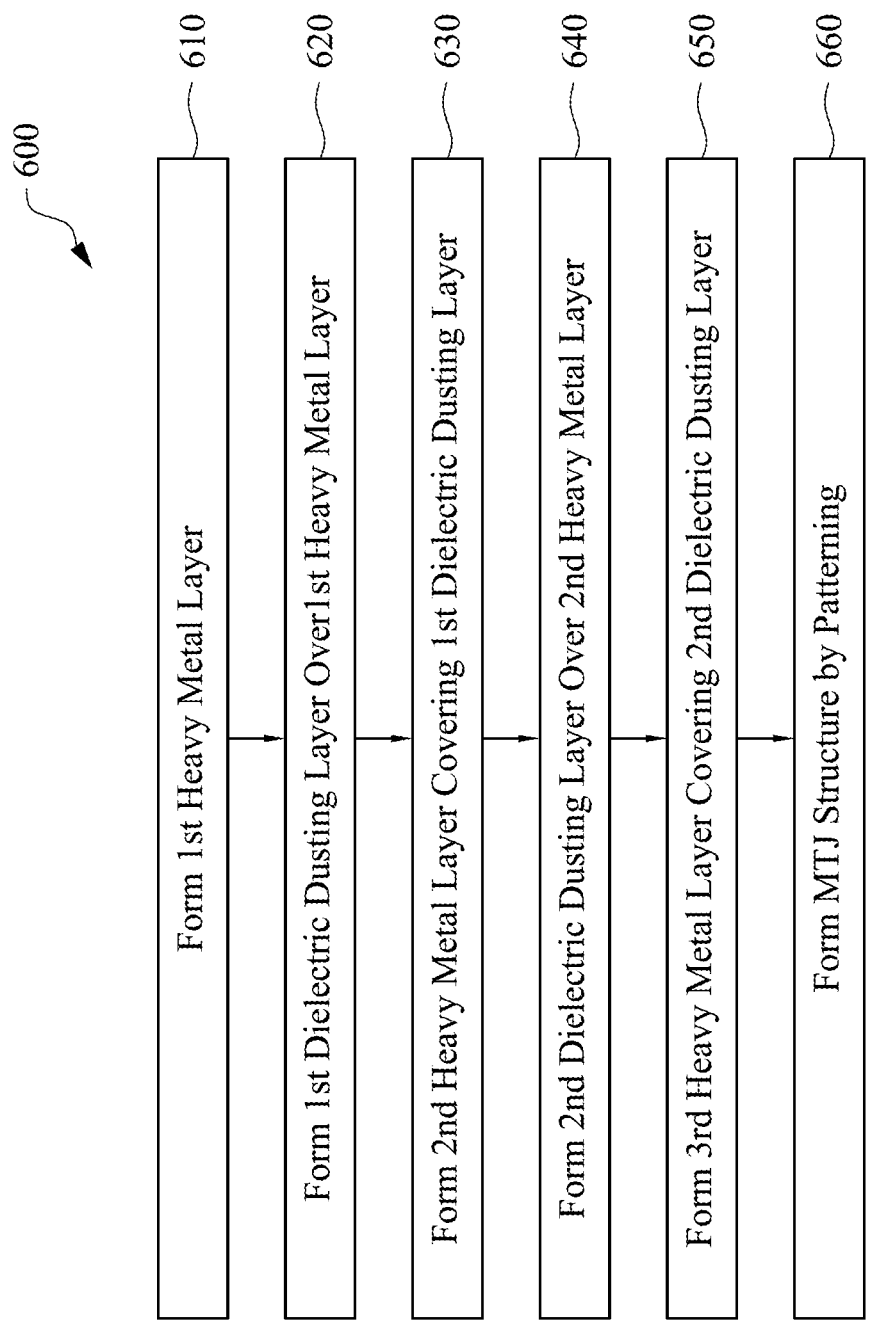
FIG. 6 is another example process according to the disclosure.

FIG. 6 shows an example process 600 of forming the write channel 550. FIGS. 7A to 7H show various stages of a wafer 700 in the example process 600.

Figure 7C:
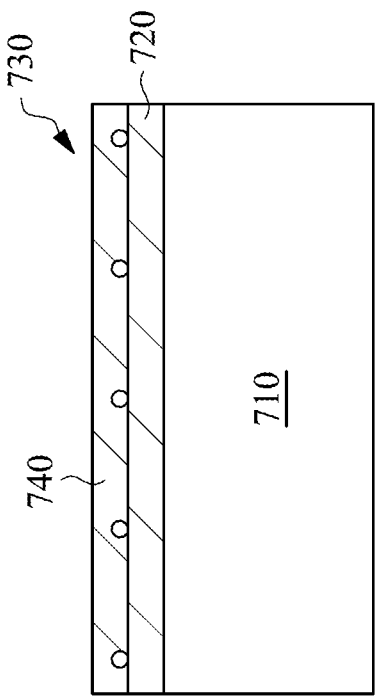
FIGS. 7A to 7H are various states of a wafer under the example process of FIG. 6.
Figure 7D:
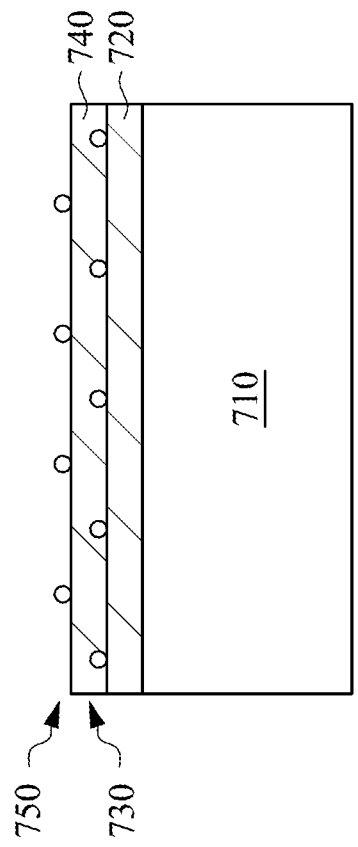
Figure 7A:
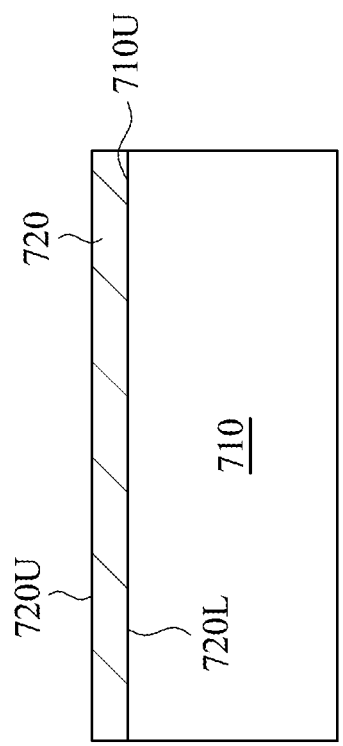
Figure 7B:
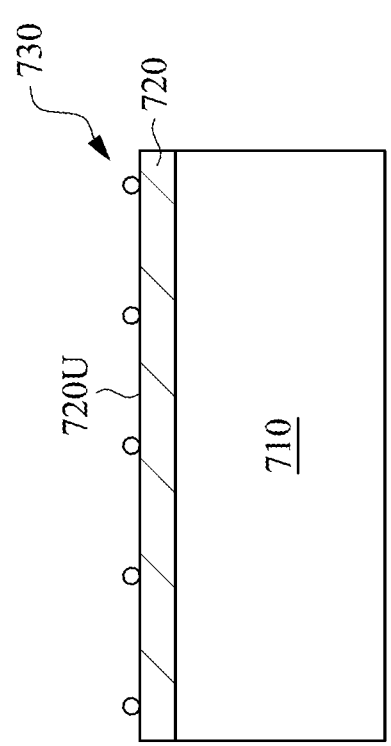
Figure 7G:
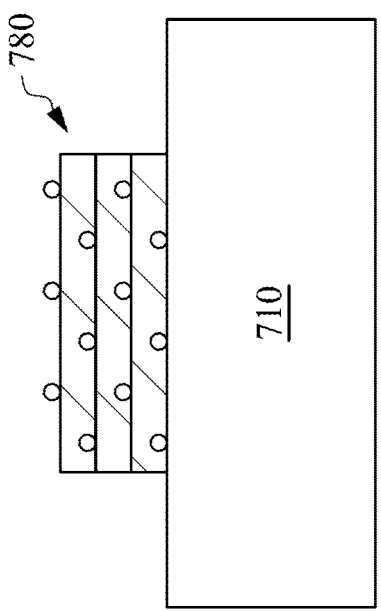
Figure 7H:
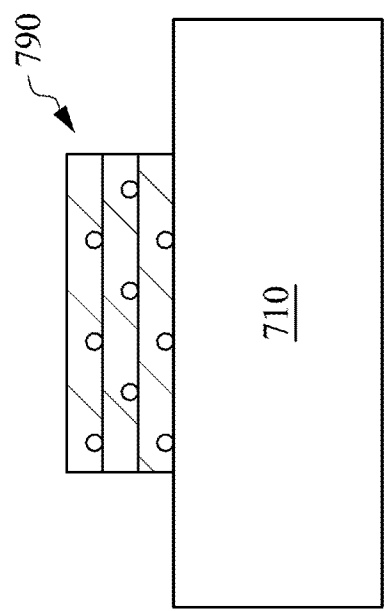

Referring to FIG. 6, in example operation 610, with reference also to FIG. 7A, a first layer 720 of a heavy metal material, e.g., tungsten, is formed over a substrate 710. A surface 710U of the substrate 710 may include a combination of dielectric materials, e.g., silicon oxide or low-K dielectric material, and metal features like interconnect structures and/or electrodes. The first tungsten layer 720 is deposited as a thin film using pulsed laser deposition, chemical vapor deposition, atomic layer deposition, sputtering or other suitable deposition techniques. The thickness of the first tungsten layer 720 is controlled to be in a range of about 5 Å to about 15 Å. In an embodiment, the thickness of the first tungsten layer 720 is controlled to be in a range of about 5 Å to about 10 Å. The controlled thickness ranges facilitate the SOT effects in that electrons bunce between/among the dielectric molecules deposited on upper surface 720U and/or lower surface 720L of the first tungsten layer 720.

In example operation 620, a first dusting layer 730 of a dielectric material, e.g., MgO, is formed over the first tungsten layer 720. The first MgO dusting layer is deposited using atomic layer deposition, molecular layer deposition or other suitable deposition techniques suitable for molecule scale deposition of the MgO. In an embodiment, the deposition process of MgO is controlled such that the thickness, e.g., average thickness, of the deposited MgO material 730 is less than a diameter of a single MgO molecule. In an embodiment, the thickness of the first MgO dusting layer 730 is in a range of between about 0.5 Å to about 1 Å. Such a thickness of the MgO deposition facilitates that the MgO molecules are scattered randomly in-plane on the upper surface 720U of the first tungsten layer 720 and are separated from one another. In some scenarios, some of the randomly scattered MgO molecules may bond together to form a molecule cluster, but such molecule cluster is still randomly scattered among MgO molecules and does not form a continuous film or flake of MgO. In some embodiments, measures are taken to reduce the likelihood that a MgO cluster is formed. For example, the surface temperature of the upper surface 720U of the first heavy metal layer 720 may be increased to increase the surface energy level, which prevents the MgO molecules from bonding together.

In example operation 630, with reference also to FIG. 7C, a second tungsten layer 740 is formed over the first MgO layer 730. The second MgO layer 740 may be formed using a same procedure as the first MgO layer 720 or may be formed using a different procedure. For example, for the CVP deposition of tungsten, different deposition temperatures may lead to different lattice features of the tungsten, e.g., with different keyhole sizes. At the same time, the deposition temperature of the second tungsten layer 740 may affect the diffusion of the MgO molecules of the first MgO dusting layer 730 into one or more of the first tungsten layer 720 or the second tungsten layer 740. As such, the deposition temperature of the second tungsten layer 740 may be controlled to avoid or control the potential diffusion of the MgO molecules of the first MgO layer 730 into the first and/or second tungsten layer 720, 740. Further, the materials of the heavy metal layers 720, 740 may be selected to be resistive to high-temperature MgO diffusion during subsequent fabrication processes, e.g., annealing.

In example operation 640, with reference also to FIG. 7D, a second dielectric dusting layer 750 is formed over the second tungsten layer 740. In an embodiment, the second dielectric dusting layer 750 includes a same MgO material as the first MgO dusting layer 730, which is not limiting. In an embodiment, the thickness of the second dielectric dusting layer 750 is controlled to be smaller than a molecule diameter of the dielectric material of the second dielectric dusting layer 750.

Figure 7E:
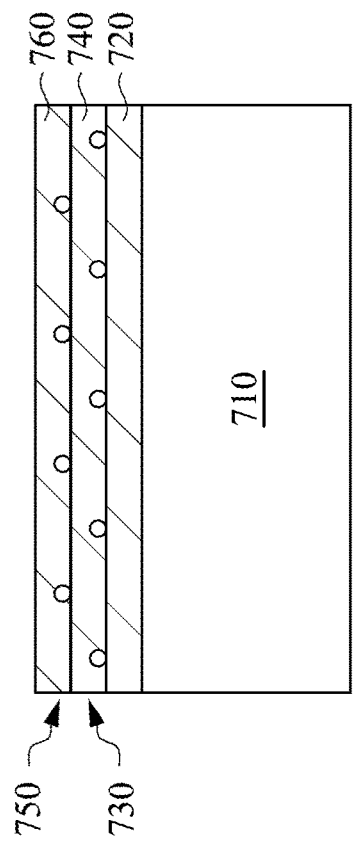

In example operation 650, with reference also to FIG. 7E, a third tungsten layer 760 is formed over and covering the second dielectric dusting layer 750.

In an embodiment, the thickness of the second and third tungsten layers 740, 760 is controlled to be in a range of about 5 Å to about 10 Å. In an embodiment, the thickness one or more of the second and third tungsten layers 740, 760 is substantially the same as that of the first tungsten layer 720. In another embodiment, the thickness of the second tungsten layer 740, which is adjacent to two layers of dielectric dusting layers 730, 750, is different from that of at least one of the first tungsten layer 720 or the third tungsten layer 760, which are each adjacent to one dielectric dusting layer 730 or 750, respectively.

Figure 7F:
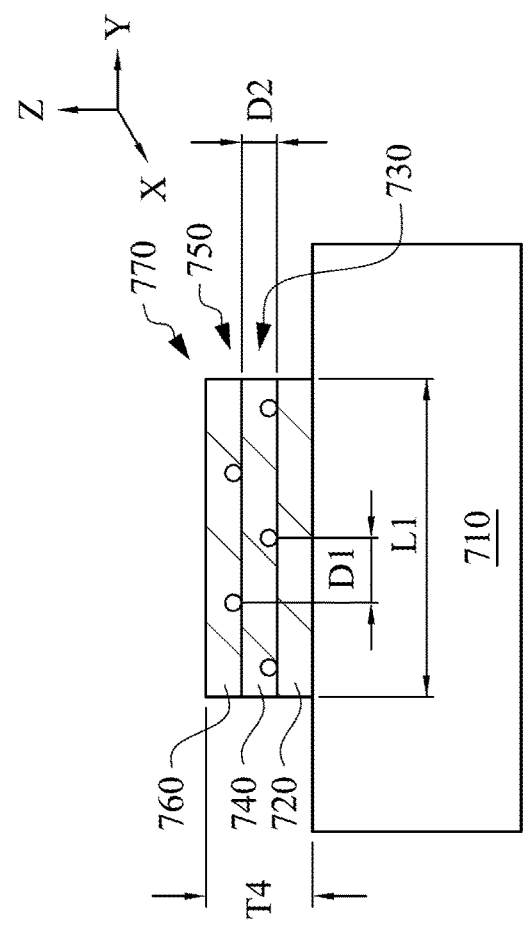

In example operation 660, with reference also to FIG. 7F, the first, second, third tungsten layers 720, 740, 760 and the first and second MgO dusting layers 730, 750 are patterned together to form a write channel layer 770. The patterning may be implemented through photoresist, photolithography and etching. The patterning process is optional and only applicable to some embodiments. In another embodiment, the first, second, and third MgO layers 720, 740, 760 and the first and second dielectric layers 730, 750 are formed within a trench or recess that defines the write channel structure and patterning is not needed.

The write channel layer 770 includes three heavy metal layers 720, 740, 760 and two dielectric dusting layers 730, 750 each sandwiched between two adjacent heavy metal layers 720 and 740 or 740 and 760, respectively. The molecules of the dielectric material of the dielectric dusting layers 730, 750 are scattered randomly in-plane in the interface between the adjacent two heavy metal layers. More specifically, the molecules of the dielectric material are positioned randomly on the upper surface of the underlying heavy metal layer and are covered by the overlaying heavy metal layer.

In an embodiment, a distance D1 between two discrete molecules of a same dielectric dusting layer 730, 750 in the lateral plane, e.g., the x-axis, y-axis or the x-y plane, is larger than a distance D2 between two discrete molecules of different dielectric dusting layers 730, 750 in the vertical direction, e.g., the z-axis. As such, the dielectric dusting layers 730, 750 affect the resistance of the write channel layer 770 more on the x-y plane, e.g., in a lateral direction, than in a vertical direction, z-axis. Further, in an embodiment, an overall thickness T4 of the write channel layer 770 is less than about 5 nm, which is smaller than a length L1 of the write channel 770. As such, the write channel layer 770 includes a larger resistance value in the longitudinal direction, e.g., direction of the length L1, than in the vertical direction, e.g., the direction of the thickness T4. Note that the length L1 is measured in the direction where a write current is injected and flows through the write channel 770.

It should be appreciated that the write channel 770 may include more or less heavy metal layers and more or less dielectric dusting layers. In some embodiments, all dielectric dusting layers are sandwiched between heavy metal layers, e.g., the total number of heavy metal layers is larger than the total number of dielectric dusting layers. In other embodiment, all heavy metal layers are sandwiched between dielectric dusting layers, e.g., the total number of dielectric dusting layers is larger than the total number of heavy metal layers, as shown by example write channel layer 780 of FIG. 7G. In a further embodiment, the dielectric dusting layers and the heavy metal layers are stacked in an alternating manner and a same number of heavy metal layer and dielectric dusting layers are included in the write channel layer, as illustratively shown in example write channel layer 790 of FIG. 7H.

The molecules of the dielectric dusting layers 730, 750, are initially positioned one or more of on an underlying heavy metal layer or covered by an overlying heavy metal layer. That is, initially, the molecules of the dielectric dusting layers 730, 750 are not in the heavy metal layers 720, 740, 760. As the fabrication of the wafer continues, the subsequent processes may enable the molecules of the dielectric dusting layers 730, 750 to diffuse into the adjacent heavy metal layers 720, 740, 760. Such diffusion processes may be controlled as illustrated by FIGS. 3B and 3C. The parameters of the subsequent processes, e.g., the annealing temperatures, may be designed with consideration of this diffusion process. The materials for the heavy metal layers may be selected to either facilitate or prevent the diffusion scenario depending on the SOT-MRAM device designs and/or the SOT-MRAM circuitry designs.

Figure 8:
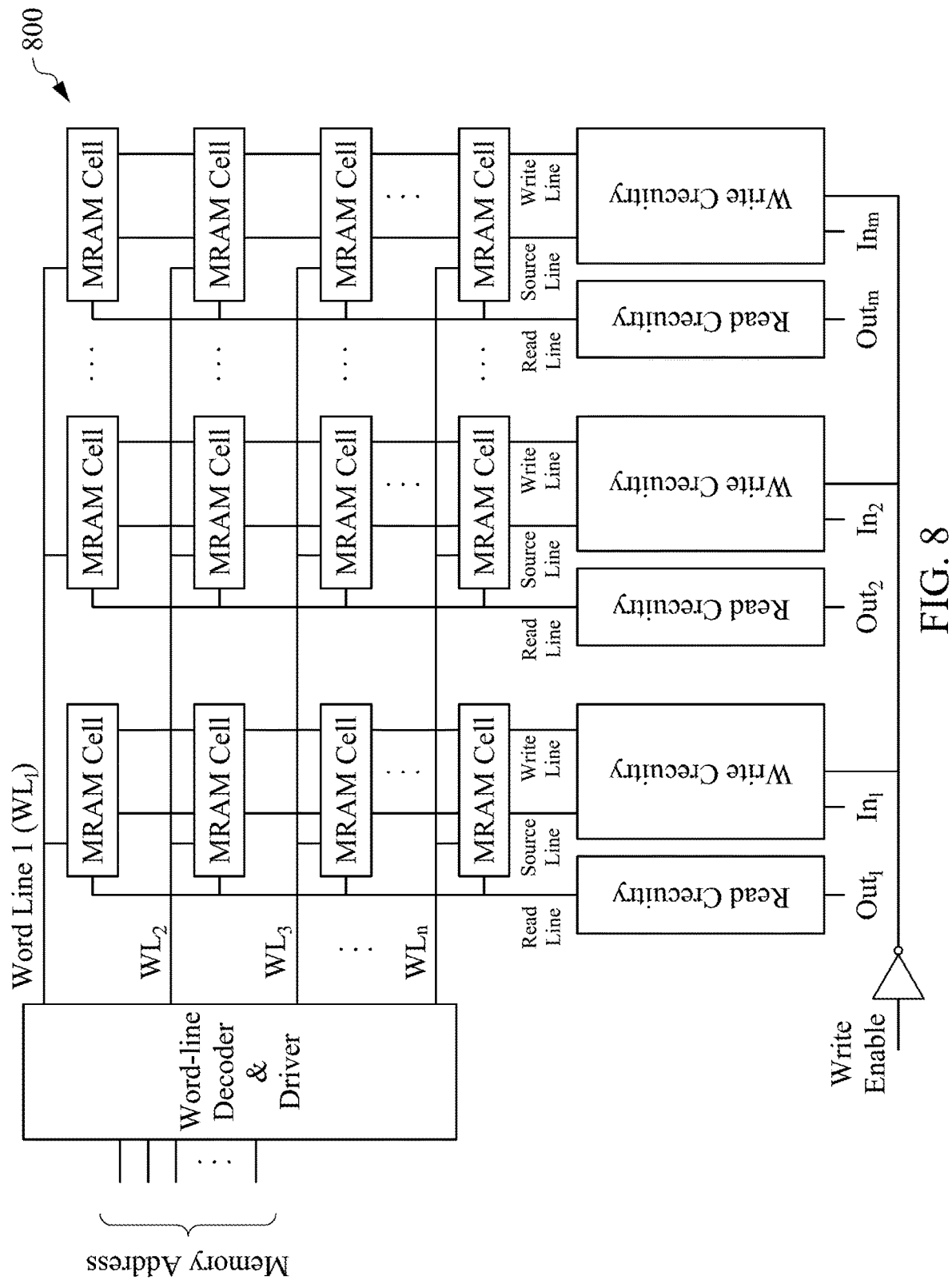
FIG. 8 is an example SOT-MRAM architecture.

In the description herein, the read and write lines of the MRAM cells are illustrated as implemented through Word lines, which is not limiting. It is also possible, depending on MRAM circuitry design, that the read and write lines are implemented through Bit lines. For example, FIG. 8 illustrates an example MRAM architecture 800. In the example architecture 800, the write Bit line and the read Bit line are controlled by an example write enable signal which, for example, turns on/off the transistors to enable the write or read function of each MRAM cell in the architecture 800. Other SOT-MRAM architectures are also possible and included in the disclosure.

In the description herein, the write channel 550 is formed before and below the MTJ structure 560, which is not limiting. In other embodiments, the write channel is formed over the MTJ structure, with the free layer of the MTJ structure stacked over the reference layer. The write channel being formed subsequent to the MTJ structure is advantageous in some scenarios because the write channel will not be impacted by the annealing process of modifying the lattice structures of the ferromagnetic layers of the MTJ structure.

The layers 130, 550 are referred to as write channel layers for descriptive purposes only. It does not indicate that a write operation to the respective MTJ structure is necessarily conducted through the layers 130, 550. For example, a MRAM may be written through a write-channel layer under the SOT effect for one of the logic state and may be written through the STT current flowing through the MTJ structure for another one of the logic state. As such, the layers 130, 550 are also referred to as a spin-orbit torque layer or "SOT layer." In this description, a "SOT layer/structure" and a "write channel layer/structure" can be used interchangeably without changing the scope or meaning of any one of the two terms, and without changing the scope of the disclosure.

In the description, the structures 770, 780, 790 are described as configured to be a SOT channel for a SOT-MRAM, which is not limiting. A similar structure may be used for other scenarios where increased resistance is desired for a conductive layer. For example, the structures 770, 780, 790 may be used as an electrode in a STT-MRAM bit cell.

The source/drain regions 524, 526 includes one or more of Ge, Si, GaAs, AlGaAs, SiGe, GaAsP, SiP, SiC, silicon-carbon-phosphide ("SiCP"), silicon-germanium-boron ("SiGeB") or other suitable semiconductor materials and may be doped in-situ during the epitaxy process by the supply of impurity sources or may be doped through post implantation process. The possible dopants include boron for SiGe, carbon for Si, phosphorous for Si or SiCP.

The gate electrode 522 of the transistor 520 includes a conductive material, e.g., a metal or a metal compound. Suitable metal materials for the gate electrode include ruthenium, palladium, platinum, cobalt, nickel, and/or conductive metal oxides and other suitable P type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N type metal materials. In some examples, the gate electrode 522 includes a work function layer tuned to have a proper work function for enhanced performance of the field effect transistor devices. For example, suitable N type work function metals include Ta, TiAl, TiAlN, TaCN, other N type work function metal, or a combination thereof, and suitable P type work function metal materials include TiN, TaN, other p-type work function metal, or a combination thereof. In some examples, a conductive layer, such as an aluminum layer, is formed over the work function layer such that the gate electrode includes a work function layer disposed over the gate dielectric and a conductive layer disposed over the work function layer and below the gate cap. In an example, the gate electrode has a thickness ranging from about 5 nm to about 40 nm depending on design requirements.

The gate dielectric layer includes a high dielectric constant (high K) dielectric material selected from one or more of hafnium oxide (HfO$_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, may include a dielectric constant (K) value larger than 6. Depending on design requirements, a dielectric material of a dielectric contact (K) value of 9 or higher may be used. The high K dielectric layer may be formed by atomic layer deposition (ALD) or other suitable technique. In accordance with embodiments described herein, the high K dielectric layer includes a thickness ranging from about 10 to about 30 angstrom (Å) or other suitable thickness.

The substrate 510, 710 may include a silicon substrate in crystalline structure and/or other elementary semiconductors like germanium. Alternatively or additionally, the substrate may include a compound semiconductor such as silicon carbide, gallium arsenide, indium arsenide, and/or indium phosphide. Further, the substrate may also include a silicon-on-insulator (SOI) structure. The substrate may include an epitaxial layer and/or may be strained for performance enhancement. The substrate may also include various doping configurations depending on design requirements as is known in the art such as p-type substrate and/or n-type substrate and various doped regions such as p-wells and/or n-wells.

The semiconductor structure/transistor device 520 is a lateral or a vertical transistor or other semiconductor devices, like bipolar devices. The transistor is finFET, tunnel FET ("TFET"), gate-all-around ("GAA") or other devices depending MRAM circuitry design.

The present disclosure may be further appreciated with the description of the following embodiments:

In a method embodiment, a first heavy metal layer is formed over a substrate. A dielectric material is deposited over the first heavy metal layer. An average thickness of the deposited dielectric material is controlled to be less than a diameter of a molecule of the dielectric material. A second heavy metal layer is formed over the dielectric material and the first heavy metal layer.

In a structure embodiment, a structure includes a magnetic tunnel junction structure that has a reference layer, a free layer and a tunneling barrier layer sandwiched between the reference layer and the free layer and a spin-orbit torque layer adjacent to the free layer of the magnetic tunnel junction structure. The spin-orbit torque layer includes a first heavy metal layer, a second heavy metal layer and a first dielectric layer sandwiched between the first heavy metal layer and the second heavy metal layer.

In a memory device embodiment, a memory device includes a substrate, a transistor over the substrate, and a magnetoresistive random access memory cell over the transistor. The transistor has a first source/drain terminal, a second source/drain terminal and a gate terminal. The a magnetoresistive random access memory cell includes a magnetic tunnel junction structure and a spin-orbit torque structure adjacent to the magnetic tunnel junction structure. The device further includes a write signal line coupled to the gate terminal and a first current node coupled to the first source/drain terminal. A first end of the spin-orbit torque structure coupled to the second source/drain terminal. A second end of the spin-orbit torque structure coupled to a second current node. The spin-orbit torque structure includes a first heavy metal layer, a second heavy metal layer stacked over the first heavy metal layer, and a first plurality of molecules of a dielectric material scattered adjacent to an interface between the first heavy metal layer and the second heavy metal layer.

What is claimed is:

1. A method, comprising:
   forming a first heavy metal layer over a substrate;
   depositing a dielectric material over the first heavy metal layer;
   forming a second heavy metal layer over the dielectric material and the first heavy metal layer;
   diffusing elements of the dielectric material into one or more of the first heavy metal layer or the second heavy metal layer; and
   forming a magnetic tunnel junction structure vertically adjacent to one of the first heavy metal layer or the second heavy metal layer the magnetic tunnel junction structure including a reference layer, a free layer and a tunnelling barrier layer vertically between the reference layer and the free layer, and the magnetic tunnel junction structure being separate from each of the first heavy metal layer, the dielectric material, and the second heavy metal layer.

2. The method of claim 1, wherein the depositing the dielectric material forms a plurality of molecules of the dielectric material randomly distributed in-plane on a surface of the first heavy metal layer.

3. The method of claim 1, wherein the first heavy metal layer and the second heavy metal layer are each thinner than about 10 Å.

4. The method of claim 1, wherein the average thickness of the deposited dielectric material is less than about 1 Å.

5. The method of claim 1, wherein the first heavy metal layer is one or more of tungsten, platinum, or tantalum.

6. The method of claim 1, wherein the dielectric material is one or more of magnesium oxide, silicon dioxide or iron (III) oxide.

7. The method of claim 1, wherein after the forming the magnetic tunnel junction structure, the one of the first heavy metal layer or the second heavy metal layer adjacent to the magnetic tunnel junction structure fully overlaps the free layer of the magnetic tunnel junction structure.

8. A method, comprising:
   forming a spin-orbit torque layer over a substrate, the spin-orbit torque layer including a vertical stack of a first heavy metal layer, a second heavy metal layer, a third heavy metal layer, a first dielectric layer vertically between the first heavy metal layer and the second heavy metal layer, and a second dielectric layer vertically between the second heavy metal layer and the third heavy metal layer; and
   forming a magnetic tunnel junction structure vertically adjacent to the spin-orbit torque layer, the magnetic tunnel junction structure including a reference layer, a free layer and a tunneling barrier layer vertically between the reference layer and the free layer, and the free layer being closer to the spin-orbit torque layer than the reference layer.

9. The method of claim 8, wherein the forming the spin-orbit torque layer includes diffusing elements of a dielectric material of the first dielectric layer into one or more of the first heavy metal layer or the second heavy metal layer.

10. The method of claim 9, wherein the diffusing includes diffusing discrete molecules of the dielectric material of the first dielectric layer to be randomly distributed in-plane in a surface of one or more of the first heavy metal layer or the second heavy metal layer.

11. The method of claim 9, wherein the diffusing the first dielectric layer includes diffusing discrete molecules of the dielectric material of the first dielectric layer to be positioned within one or more of the first heavy metal layer or the second heavy metal layer.

12. The method of claim 9, wherein after the defusing diffusing, the first heavy metal layer and the second heavy metal layer interface with one another, and
wherein the diffusing the first dielectric layer includes diffusing individual molecules of the dielectric material of the first dielectric layer to be randomly distributed in-plane in an interface between the first heavy metal layer and the second heavy metal layer.

13. The method of claim 12, wherein a lateral distance between a first molecule of the first dielectric layer and a second molecule of the first dielectric layer that is laterally adjacent to the first molecule being larger than a vertical distance between the first molecule of the first dielectric layer and a third molecule of the second dielectric layer that is vertically adjacent to the first molecule.

14. The method of claim 8, wherein after the forming the magnetic tunnel junction structure, the spin-orbit torque layer fully overlaps the free layer of the magnetic tunnel junction structure.

15. The method of claim 8, wherein the first heavy metal layer, the second heavy metal layer, and the third heavy metal layer are each one or more of tungsten, platinum, or tantalum.

16. The method of claim 8, wherein the first dielectric layer and the second dielectric layer each include one or more of magnesium oxide, silicon dioxide or iron (III) oxide.

17. A method, comprising:
forming a transistor over a substrate, the transistor having a first source/drain terminal, a second source/drain terminal and a gate terminal;
forming a magnetoresistive random access memory cell over the transistor, the magnetoresistive random access memory cell including a magnetic tunnel junction structure and a spin-orbit torque structure adjacent to the magnetic tunnel junction structure;
forming a write signal line coupled to the gate terminal; and
forming a first current node coupled to the first source/drain terminal;
wherein a first end of the spin-orbit torque structure coupled to the second source/drain terminal, and a second end of the spin-orbit torque structure coupled to a second current node; and
wherein the forming the spin-orbit torque structure includes:
forming a first heavy metal layer, a second heavy metal layer stacked over the first heavy metal layer and a third heavy metal layer stacked over the second heavy metal layer;
diffusing a first plurality of molecules of a dielectric material scattered adjacent to an interface between the first heavy metal layer and the second heavy metal layer; and
diffusing a second plurality of molecules of a dielectric material scattered adjacent to an interface between the second heavy metal layer and the third heavy metal layer.

18. The method of claim 17, wherein the first plurality of molecules are positioned randomly in-plane on a surface of the first heavy metal layer and are covered by the second heavy metal layer.

19. The method of claim 17, wherein the first plurality of molecules are discrete from one another and are positioned on the interface between the first heavy metal layer and the second heavy metal layer.

20. The method of claim 17, wherein the first plurality of molecules are diffused into one or more of the first heavy metal layer or the second heavy metal layer and adjacent to the interface between the first heavy metal layer and the second heavy metal layer.

* * * * *